US009019040B2

(12) United States Patent
Takamine

(10) Patent No.: US 9,019,040 B2
(45) Date of Patent: Apr. 28, 2015

(54) ELASTIC WAVE BRANCHING FILTER

(71) Applicant: Murata Manufacturing Co., Ltd., Nagaokakyo-shi, Kyoto-fu (JP)

(72) Inventor: Yuichi Takamine, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 277 days.

(21) Appl. No.: 13/771,108

(22) Filed: Feb. 20, 2013

(65) Prior Publication Data
US 2013/0154763 A1 Jun. 20, 2013

Related U.S. Application Data

(63) Continuation of application No. PCT/JP2011/064929, filed on Jun. 29, 2011.

(30) Foreign Application Priority Data

Sep. 10, 2010 (JP) ................. 2010-203431

(51) Int. Cl.
*H03H 9/72* (2006.01)
*H03H 9/64* (2006.01)
*H03H 7/46* (2006.01)
*H03H 7/42* (2006.01)
*H03H 9/00* (2006.01)
(Continued)

(52) U.S. Cl.
CPC ............... *H03H 7/461* (2013.01); *H03H 9/008* (2013.01); *H03H 9/0085* (2013.01); *H03H 9/02748* (2013.01); *H03H 9/02929* (2013.01); *H03H 9/14579* (2013.01); *H03H 9/6483* (2013.01); *H03H 9/6496* (2013.01); *H03H 9/725* (2013.01); *H03H 7/42* (2013.01)

(58) Field of Classification Search
USPC ........... 333/133, 193–196; 310/313 B, 313 D
See application file for complete search history.

(56) References Cited

U.S. PATENT DOCUMENTS 5,694,096 A * 12/1997 Ushiroku et al. ............. 333/195
2007/0296522 A1 12/2007 Takamine
2008/0284540 A1 11/2008 Nishihara et al.
(Continued)

FOREIGN PATENT DOCUMENTS

CN 101467349 A 6/2009
DE 10 2005 010 658 A1 9/2006
(Continued)

OTHER PUBLICATIONS

Official Communication issued in International Patent Application No. PCT/JP2011/064929, mailed on Sep. 13, 2011.

Primary Examiner — Barbara Summons
(74) Attorney, Agent, or Firm — Keating & Bennett, LLP

(57) ABSTRACT

An elastic wave surface acoustic wave duplexer includes an antenna terminal, a transmission filter, a reception filter, and a plurality of elastic wave resonators connected in series between the antenna terminal and the reception filter. The reception filter is a longitudinally coupled resonator-type surface acoustic wave filter including a plurality of IDT electrodes and arranged along a propagation direction of elastic wave. A combined capacitance of the plurality of surface acoustic wave resonators is smaller than a capacitance of the IDT electrodes and included in the plurality of IDT electrodes and connected to the antenna terminal.

18 Claims, 5 Drawing Sheets

(51) Int. Cl.
  *H03H 9/02* (2006.01)
  *H03H 9/145* (2006.01)

(56) References Cited

U.S. PATENT DOCUMENTS

| | | |
|---|---|---|
| 2009/0009263 A1 | 1/2009 | Javid et al. |
| 2009/0051457 A1* | 2/2009 | Bauer et al. ................... 333/4 |
| 2009/0058555 A1 | 3/2009 | Takata et al. |
| 2009/0315640 A1 | 12/2009 | Umeda et al. |

FOREIGN PATENT DOCUMENTS

| | | |
|---|---|---|
| JP | 2005-184143 A | 7/2005 |
| JP | 2008-005151 A | 1/2008 |
| JP | 2008-271230 A | 11/2008 |
| JP | 2010-021914 A | 1/2010 |

* cited by examiner

ELASTIC WAVE BRANCHING FILTER

BACKGROUND OF THE INVENTION

1. Field of the Invention

The present invention relates to an elastic wave branching filter.

2. Description of the Related Art

In recent years, elastic wave branching filters using elastic waves, such as surface acoustic waves and boundary acoustic waves, have been widely used in communication devices, such cellular phones. For example, Japanese Unexamined Patent Application Publication No. 2008-5151 discloses a surface acoustic wave branching filter illustrated in FIG. 8.

As illustrated in FIG. 8, a surface acoustic wave branching filter 100 includes a transmission filter 104 connected between an antenna terminal 101 and a transmitting terminal 102 and a reception filter 105 connected between the antenna terminal 101 and receiving terminals 103a and 103b. In the surface acoustic wave branching filter 100, the reception filter 105 is formed by a longitudinally coupled resonator-type surface acoustic wave filter. A surface acoustic wave resonator 106 is connected between the reception filter 105 and the antenna terminal 101. With the provision of the surface acoustic wave resonator 106, it is possible to adjust the phase difference between the transmission filter 104 and the reception filter 105.

However, the reception filter 105 of the surface acoustic wave branching filter 100 has a nonlinear characteristic, and thus IMD (Intermodulation Distortion) occurs. For example, if the frequency of an interference wave signal input from the antenna terminal 101 matches the value calculated from a numerical formula of (frequency of transmitted signal×2-frequency of received signal), the frequency of IMD generated from the transmitted signal and the interference wave signal matches the frequency of the received signal. Therefore, there is a problem of deterioration of the sensitivity of the received signal.

SUMMARY OF THE INVENTION

In view of the above-described issue, preferred embodiments of the present invention provide an elastic wave branching filter that significantly reduces and prevents the occurrence of IMD and has a superior transmission characteristic.

An elastic wave branching filter according to a preferred embodiment of the present invention includes an antenna terminal, a transmission filter, a reception filter, and a plurality of elastic wave resonators. The transmission filter is connected to the antenna terminal. The reception filter is connected to the antenna terminal. The reception filter includes a longitudinally coupled resonator-type elastic wave filter including a plurality of IDT electrodes arranged along a propagation direction of elastic wave. The plurality of elastic wave resonators are connected in series between the antenna terminal and the reception filter. A combined capacitance C1 of the plurality of elastic wave resonators is smaller than a capacitance C2 of an IDT electrode included in the plurality of IDT electrodes and connected to the antenna terminal.

If the plurality of IDT electrodes include a plurality of IDT electrodes connected to the antenna terminal, the capacitance C2 corresponds to the combined capacitance of the plurality of IDT electrodes included in the plurality of IDT electrodes and connected to the antenna terminal.

In a specific aspect of the elastic wave branching filter according to a preferred embodiment of the present invention, at least two elastic wave resonators of the plurality of elastic wave resonators are preferably different from each other in frequency characteristic.

In another specific aspect of the elastic wave branching filter according to a preferred embodiment of the present invention, the at least two elastic wave resonators are preferably different from each other in pitch of electrode fingers.

In a different specific aspect of the elastic wave branching filter according to a preferred embodiment of the present invention, the at least two elastic wave resonators are preferably different from each other in duty ratio of electrode fingers.

In still another specific aspect of the elastic wave branching filter according to a preferred embodiment of the present invention, the number of the elastic wave resonators is preferably three or more.

In a still different specific aspect of the elastic wave branching filter according to a preferred embodiment of the present invention, the elastic wave branching filter preferably is a surface acoustic wave branching filter or a boundary acoustic wave branching filter.

In various preferred embodiments of the present invention, at least two of the plurality of elastic wave resonators have mutually different anti-resonant frequencies. Thus, the occurrence of IMD is significantly reduced and prevented, and it is therefore possible to attain a superior transmission characteristic.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A preferred embodiment of the present invention will be described below with reference to, as an example, a surface acoustic wave duplexer 1 illustrated in FIG. 1, which serves as an elastic wave branching filter. The surface acoustic wave duplexer 1, however, is merely an exemplification. An elastic wave branching filter according to the present invention is not limited at all to the surface acoustic wave duplexer 1. An elastic wave branching filter according to the present invention may be, for example, an elastic wave triplexer.

Figure 1:
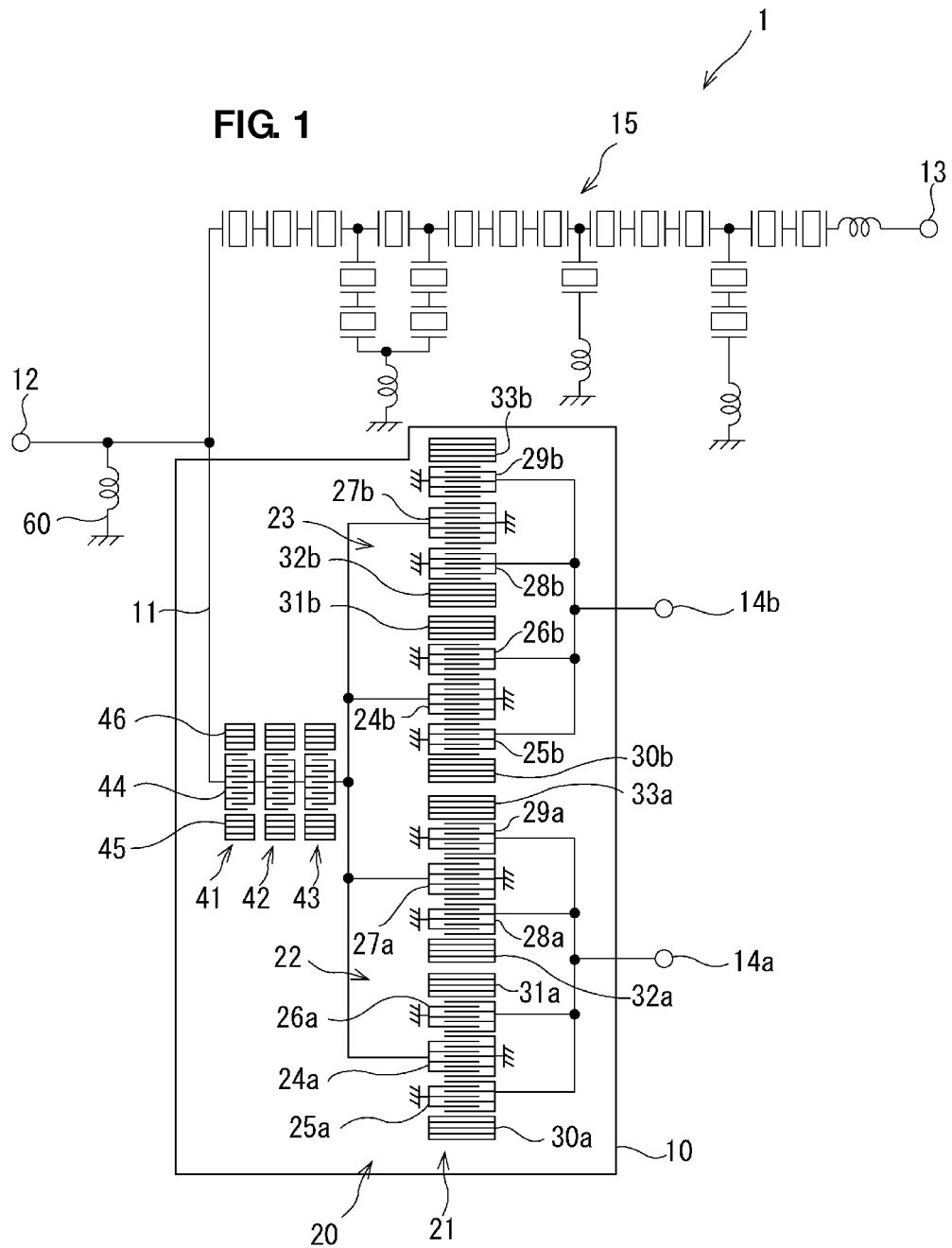
FIG. 1 is a schematic configuration diagram of a surface acoustic wave branching filter according to a preferred embodiment of the present invention.

FIG. 1 is a schematic configuration diagram of the surface acoustic wave duplexer 1 according to the present preferred embodiment. The surface acoustic wave duplexer 1 illustrated in FIG. 1 preferably is a duplexer supporting UMTS-Band1 having a balanced-unbalanced signal transforming function, for example. The transmission frequency band of UMTS-Band1 is 1920 MHz to 1980 MHz, and the reception frequency band of UMTS-Band1 is 2110 MHz to 2170 MHz.

The surface acoustic wave duplexer 1 includes an antenna terminal 12, a transmitting terminal 13, and first and second receiving terminals 14a and 14b. In the present preferred embodiment, the impedance of the antenna terminal 12 and the transmitting terminal 13 preferably is about 50Ω, and the impedance of the first and second receiving terminals 14a and 14b preferably is about 100Ω, for example.

A transmission filter 15 is connected between the antenna terminal 12 and the transmitting terminal 13. A type of the transmission filter 15 is not particularly limited. The transmission filter 15 may be, for example, a longitudinally coupled resonator-type surface acoustic wave filter. It is preferred, however, that the transmission filter 15 is a ladder elastic wave filter superior in electric power handing capability, as illustrated in FIG. 1.

A reception filter 20 is connected between the antenna terminal 12 and the first and second receiving terminals 14a and 14b. The reception filter 20 preferably is a longitudinally coupled resonator-type surface acoustic wave filter 21 having a balanced-unbalanced transforming function. The longitudinally coupled resonator-type surface acoustic wave filter 21 includes first and second longitudinally coupled resonator-type surface acoustic wave filter units 22 and 23. The first longitudinally coupled resonator-type surface acoustic wave filter unit 22 is connected between the antenna terminal 12 and the first receiving terminal 14a. Meanwhile, the second longitudinally coupled resonator-type surface acoustic wave filter unit 23 is connected between the antenna terminal 12 and the second receiving terminal 14b.

Each of the first and second longitudinally coupled resonator-type surface acoustic wave filter units 22 and 23 includes a plurality of IDT electrodes arranged along a propagation direction of surface acoustic wave. Specifically, the first and second longitudinally coupled resonator-type surface acoustic wave filter units 22 and 23 include first to third IDT electrodes 24a, 25a, and 26a and fourth to sixth IDT electrodes 27a, 28a, and 29a, and first to third IDT electrodes 24b, 25b, and 26b and fourth to sixth IDT electrodes 27b, 28b, and 29b, respectively, which are arranged along a propagation direction of surface acoustic wave. A pair of reflectors 30a and 31a are provided on the opposite sides in the propagation direction of the surface acoustic wave of a region provided with the first to third IDT electrodes 24a, 25a, and 26a, and a pair of reflectors 30b and 31b are provided on the opposite sides in the propagation direction of the elastic wave of a region provided with the first to third IDT electrodes 24b, 25b, and 26b. A pair of reflectors 32a and 33a are provided on the opposite sides in the propagation direction of the surface acoustic wave of a region provided with the fourth to sixth IDT electrodes 27a, 28a, and 29a, and a pair of reflectors 32b and 33b are provided on the opposite sides in the propagation direction of the elastic wave of a region provided with the fourth to sixth IDT electrodes 27b, 28b, and 29b. In the first to sixth IDT electrodes 24a, 25a, 26a, 27a, 28a, and 29a and the first to sixth IDT electrodes 24b, 25b, 26b, 27b, 28b, and 29b, each of the first and fourth IDT electrodes 24a and 27a and the first and fourth IDT electrodes 24b and 27b includes one comb-shaped electrode connected to the antenna terminal 12 and the other comb-shaped electrode connected to the ground potential. Each of the second, third, fifth, and sixth IDT electrodes 25a, 26a, 28a, and 29a and the second, third, fifth, and sixth IDT electrodes 25b, 26b, 28b, and 29b includes one comb-shaped electrode connected the ground potential and the other comb-shaped electrode connected in common to the first or second receiving terminal 14a or 14b. In the following description, the first and fourth IDT electrodes 24a and 27a and the first and fourth IDT electrodes 24b and 27b connected to the antenna terminal 12 will be referred to as input IDT electrodes 24a, 24b, 27a, and 27b.

A plurality of surface acoustic wave resonators are connected in series between the antenna terminal 12 and the reception filter 20. Specifically, in the present preferred embodiment, three surface acoustic wave resonators 41 to 43 are connected in series between the antenna terminal 12 and the reception filter 20. Each of the surface acoustic wave resonators 41 to 43 includes an IDT electrode 44 and a pair of reflectors 45 and 46 provided on the opposite sides of the IDT electrode 44 in the propagation direction of the elastic wave. Further, an inductor 60 is connected between a connection point of the transmission filter 15 and the reception filter 20 and the ground potential.

The surface acoustic wave resonators 41 to 43 and the inductor 60 are provided to adjust the phase between the reception filter 20 and the transmission filter 15. Each of the surface acoustic wave resonators 41 to 43 is configured to have a resonant frequency located in the pass band of the reception filter 20 and an anti-resonant frequency located in an attenuation region near the high side of the pass band.

Figure 2:
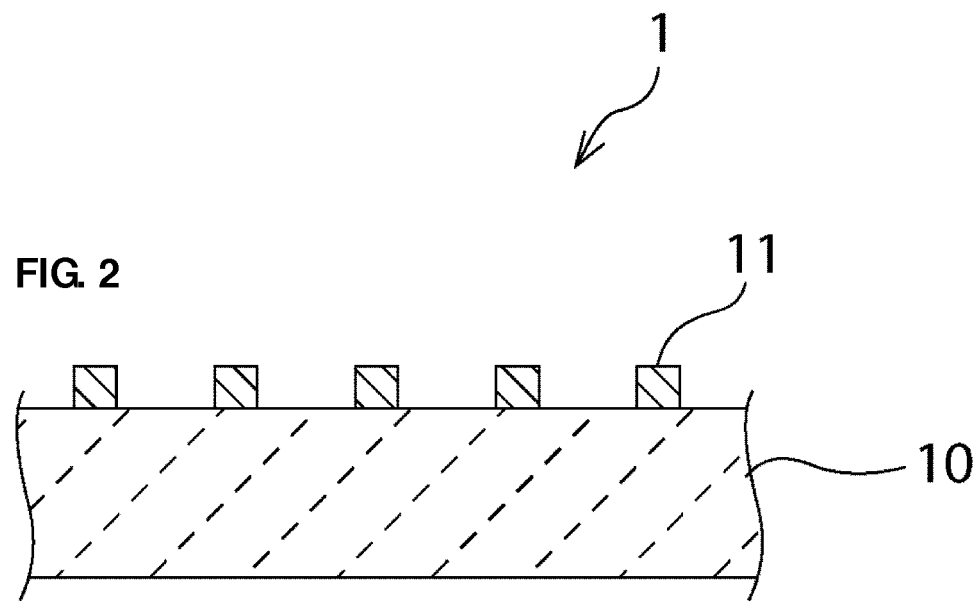
FIG. 2 is a schematic cross-sectional view of a reception filter in a preferred embodiment of the present invention.

As illustrated in FIG. 2, the surface acoustic wave duplexer 1 of the present preferred embodiment includes a piezoelectric substrate 10 and electrodes 11 located on the piezoelectric substrate 10. The electrodes 11 define the above-described IDT electrodes, reflectors, wiring lines, and so forth. In the present preferred embodiment, the piezoelectric substrate is preferably a 40±5° Y-cut X-propagation LiTaO$_3$ substrate, for example. The piezoelectric substrate 10, however, may be another piezoelectric substrate, such as a LiNbO$_3$ substrate and a crystal substrate, for example.

The electrodes 11 are preferably made of Al, for example. The electrodes 11, however, may be made of a conductive material other than Al. For example, the electrodes 11 may be made of a metal, such as Al, Pt, Au, Ag, Cu, Ni, Ti, Cr, and Pd, or an alloy including one or more of these metals. Further, the electrodes 11 may include a laminate of a plurality of conductive films made of the above-described metal or alloy.

A dielectric film, such as a silicon oxide film and a silicon nitride film, may be provided on the piezoelectric substrate 10 for the purpose of, for example, improving the frequency-temperature characteristic or protecting the IDT electrodes, the reflectors, and so forth.

Meanwhile, a portion in which IMD may occur corresponds to an IDT electrode electrically connected to the antenna terminal 12. In the present preferred embodiment, IMD may occur in the IDT electrodes 44 of the surface acoustic wave resonators 41 to 43 connected in series between the antenna terminal 12 and the reception filter 20, and in the input IDT electrodes 24a, 24b, 27a, and 27b of the longitudinally coupled resonator-type surface acoustic wave filter 21 connected in parallel between the antenna terminal 12 and the ground potential. The other IDT electrodes 25a, 25b, 26a, 26b, 28a, 28b, 29a, and 29b of the longitudinally coupled resonator-type surface acoustic wave filter 21 are merely acoustically connected to the antenna terminal 12. In the IDT electrodes 25a, 25b, 26a, 26b, 28a, 28b, 29a, and 29b, therefore, a transmitted signal and an interference wave signal are substantially attenuated, and IMD hardly occurs.

Further, which one of the IDT electrodes tends to have IMD is determined by the capacitance of the IDT electrode. For example, in a case where there are two IDT electrodes in which IMD occurs, if the capacitance of one of the IDT electrodes is smaller than the capacitance of the other IDT electrode, the impedance of the one of the IDT electrodes is relatively increased. Therefore, higher electric power is loaded on the one of the IDT electrodes, and IMD occurs therein more frequently.

In the present preferred embodiment, a combined capacitance C1 of the IDT electrodes 44 of the surface acoustic wave resonators 41 to 43 is set to be smaller than a combined capacitance C2 of the input IDT electrodes 24a, 24b, 27a, and 27b of the longitudinally coupled resonator-type surface acoustic wave filter 21. Therefore, higher electric power is applied to the surface acoustic wave resonators 41 to 43. The surface acoustic wave resonators 41 to 43, however, correspond to one surface acoustic wave resonator divided into three surface acoustic wave resonators connected in series. With a surface acoustic wave resonator divided into three portions without a change in capacitance, the total area of the IDT electrodes is increased by approximately three times. It is therefore possible to reduce the power consumption per unit area. Consequently, it is possible to significantly reduce and prevent the occurrence of IMD, and to attain a superior transmission characteristic.

This effect of improving the transmission characteristic will be described in detail below on the basis of preferred embodiment examples and a comparative example.

Preferred Embodiment Example 1

A surface acoustic wave branching filter similar in configuration to the surface acoustic wave duplexer 1 described in the above-described preferred embodiment was produced as Preferred Embodiment Example 1 with the following design parameters.
Longitudinally coupled resonator-type surface acoustic wave filter unit 22:
  Intersecting width: 46 μm
  Number of electrode fingers of IDT electrodes 25a and 26a: 28 (wherein number of electrode fingers of narrow-pitch electrode finger portions is 8)
  Number of electrode fingers of IDT electrode 24a: 71 (wherein number of electrode fingers of narrow-pitch electrode finger portion on the side of IDT electrode 25a is 4, and number of electrode fingers of narrow-pitch electrode finger portion on the side of IDT electrode 26a is 4)
  Number of electrode fingers of reflectors 30a and 31a:
  Duty ratio of IDT electrodes 24a, 25a, and 26a: 0.64
  Electrode film thickness: $0.091\lambda I$ (wherein $\lambda I$ represents wavelength of surface acoustic wave determined by pitch of electrode fingers of IDT electrodes)
  The design parameters of the IDT electrodes 27a to 29a and the reflectors 32a and 33a are the same as those of the IDT electrodes 24a to 26a and the reflectors 30a and 31a.
  Longitudinally coupled resonator-type surface acoustic wave filter unit 23: substantially the same in design as longitudinally coupled resonator-type surface acoustic wave filter unit 22 except that IDT electrodes 25b, 26b, 28b, and 29b are reversed.

Surface acoustic wave resonators 41 to 43:
  Pitch of electrode fingers of IDT electrode 44 in surface acoustic wave resonator 41: 890.0 nm
  Pitch of electrode fingers of IDT electrode 44 in surface acoustic wave resonator 42: 892.5 nm
  Pitch of electrode fingers of IDT electrode 44 in surface acoustic wave resonator 43: 895.0 nm
  Intersecting width of IDT electrode 44: 27 μm
  Number of electrode fingers of IDT electrode 44: 213
  Number of electrode fingers of reflectors 45 and 46: 18
  Duty ratio of electrode fingers of IDT electrode 44: 0.55
  Electrode film thickness: $0.095\lambda II$ (wherein $\lambda II$ represents wavelength of surface acoustic wave determined by pitch of electrode fingers of IDT electrode 44 in surface acoustic wave resonator 42)

The capacitance of an IDT electrode is proportional to the product of the intersecting width, the number of pairs (corresponding to the numerical value obtained by subtracting one from the number of electrode fingers and dividing the resultant value by two), and the duty ratio. In the present preferred embodiment example, the combined capacitance C1 of the surface acoustic wave resonators 41 to 43 is intersecting width (27 μm)×number of pairs (106 pairs)×duty ratio (0.55) ÷≈3524.7. The combined capacitance C2 of the input IDT electrodes 24a, 24b, 27a, and 27b is intersecting width (46 μm)×number of pairs (35 pairs)×duty ratio (0.64)×4≈4121.6. In the present preferred embodiment example, therefore, C1<C2 holds. Accordingly, higher electric power is applied to the surface acoustic wave resonators 41 to 43 than to the input IDT electrodes 24a, 24b, 27a, and 27b.

Preferred Embodiment Example 2

The number of surface acoustic wave resonators connected in series between the antenna terminal 12 and the reception filter 20 was set to two, and the intersecting width and the number of pairs of electrode fingers were set such that the combined capacitance of the two surface acoustic wave resonators is the same as the combined capacitance C1 of the surface acoustic wave resonators 41 to 43 of Preferred Embodiment Example 1. Specifically, the present preferred embodiment example was configured to be similar to the above-described preferred embodiment Example 1 except for the following design parameters.
  First and second surface acoustic wave resonators:
  Intersecting width of IDT electrodes: 21.2 μm Number of electrode fingers of IDT electrodes: 201

Comparative Example 1

Figure 3:
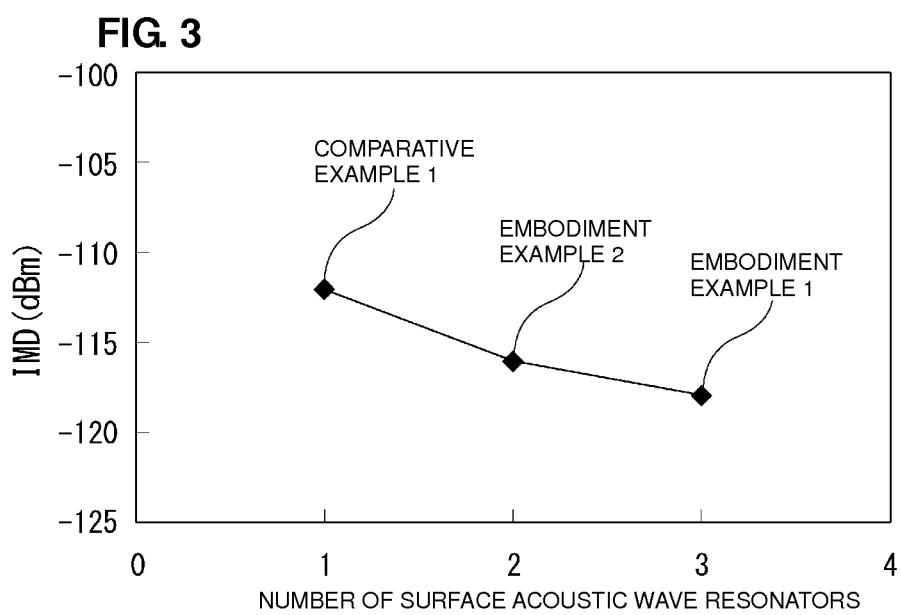
FIG. 3 is a graph illustrating IMD in Examples 1 and 2 of a preferred embodiment of the present invention and a comparative example 1.

The number of surface acoustic wave resonators connected in series between the antenna terminal 12 and the reception filter 20 was set to one, and the intersecting width and the number of pairs of electrode fingers were set such that the capacitance of the surface acoustic wave resonator is the same as the combined capacitance C1 of the surface acoustic wave resonators 41 to 43 of Preferred Embodiment Example 1. Specifically, the present example was configured to be similar to the above-described preferred embodiment Example 1 except for the following design parameters.
Surface acoustic wave resonator:
  Intersecting width of IDT electrodes: 15.9 μm
  Number of electrode fingers of IDT electrodes: 121
  FIG. 3 illustrates IMD in Preferred Embodiment Examples 1 and 2 and the comparative example 1 under the following conditions.
  Frequency of transmitted signal (Tx): 1950 MHz
  Frequency of received signal (Rx): 2140 MHz Frequency of interference wave signal (2Tx-Rx): 1760 MHz Electric power of transmitted signal (at antenna terminal): +21 dBm Electric power of interference wave signal (at antenna terminal): −15 dBm A balun is connected to Rx terminals 1 and 2, and IMD output from the Rx terminals is measured.

It is understood from the results illustrated in FIG. 3 that it is possible to significantly reduce the level of the occurring IMD by increasing the number of surface acoustic wave resonators connected in series between the antenna terminal 12 and the reception filter 20. The reason therefor is considered to be that the increase in number of surface acoustic wave resonators has resulted in a reduction in the power consumption per unit area of the IDT electrodes.

Figure 4:
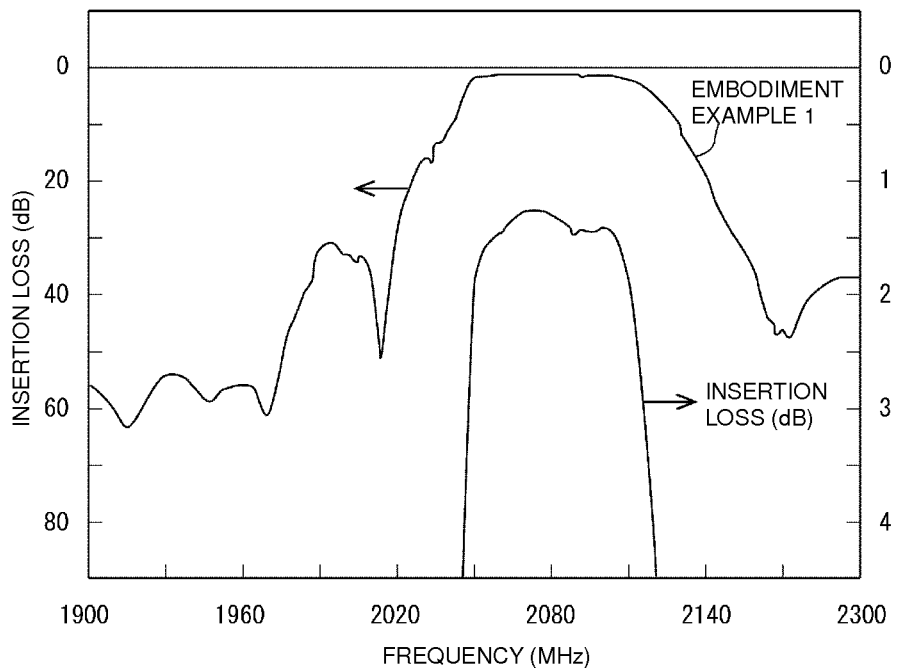
FIG. 4 is a graph illustrating an insertion loss of a reception filter in Example 1 of a preferred embodiment of the present invention.

FIG. 4 illustrates an insertion loss of the reception filter 20 of the above-described Preferred Embodiment Example 1. Further, FIG. 5 illustrates an insertion loss of the reception filter 20 of Preferred Embodiment Example 3 which is similar in configuration to Preferred Embodiment Example 1 except that the pitch of the electrode fingers is set to 892.5 nm in all of the surface acoustic wave resonators 41 to 43, and that the surface acoustic wave resonators 41 to 43 are set to be equal in frequency characteristic.

Figure 5:
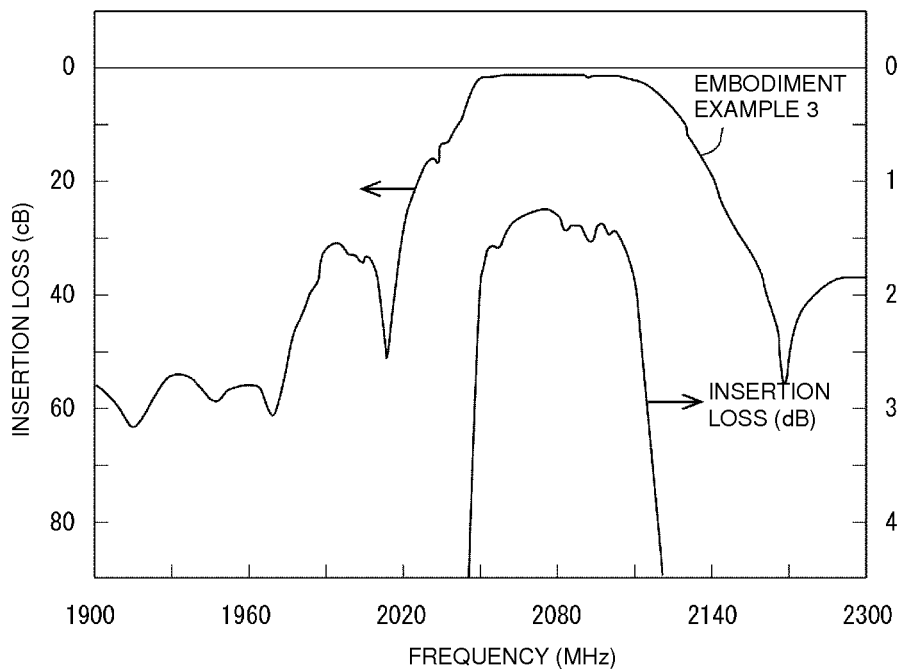
FIG. 5 is a graph illustrating an insertion loss of a reception filter in Example 3 of a preferred embodiment of the present invention.

As illustrated in FIG. 5, it is understood that a plurality of ripples are generated in the pass band in Preferred Embodiment Example 3, in which the surface acoustic wave resonators 41 to 43 are set to be equal in frequency characteristic. Meanwhile, as illustrated in FIG. 4, it is understood that the ripples in the pass band are suppressed in Preferred Embodiment Example 1, in which the surface acoustic wave resonators 41 to 43 are set to be different from one another in frequency characteristic.

As described above, it is understood that, when a plurality of surface acoustic wave resonators are connected in series between the antenna terminal and the reception filter, it is possible to suppress the ripples in the pass band by setting different frequency characteristics for the plurality of surface acoustic wave resonators.

Figure 6:
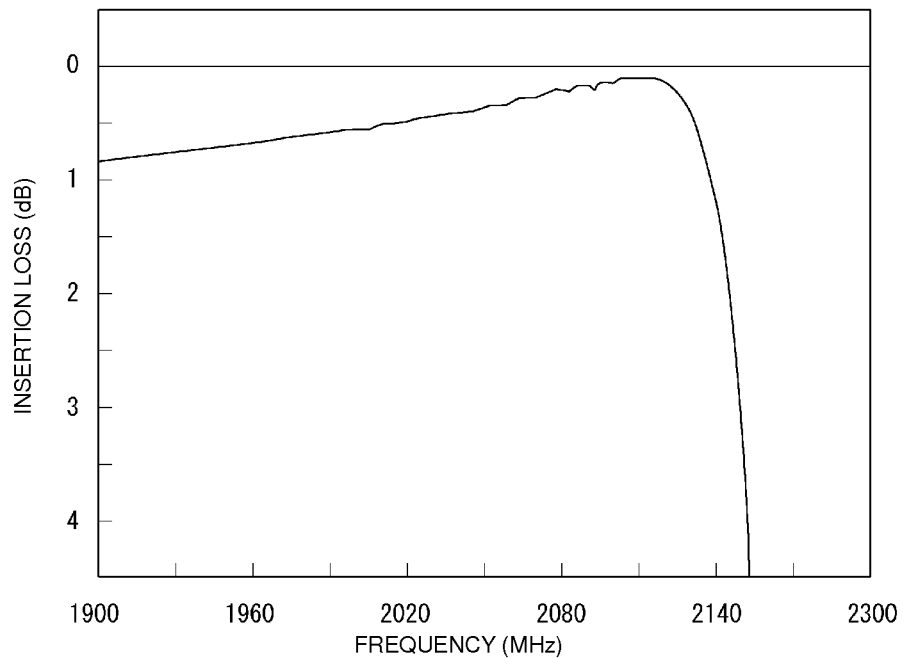
FIG. 6 is a graph illustrating an insertion loss of surface acoustic wave resonators in Example 1 of a preferred embodiment of the present invention.

The capability to suppress the ripples in the pass band is considered to be due to the following reason. That is, as illustrated in FIG. 6, each of the surface acoustic wave resonators has ripples in the pass band of the reception filter. If the plurality of surface acoustic wave resonators connected in series between the antenna terminal and the reception filter have the same frequency characteristic, it is considered that the above-described ripples occur at the same position, reinforce one another to form a large ripple, and result in a failure to obtain a superior transmission characteristic. Meanwhile, in the case where the plurality of surface acoustic wave resonators connected in series between the antenna terminal and the reception filter are different from one another in frequency characteristic, as in Preferred Embodiment Example 1, it is considered that the above-described ripples are different in frequency position and thus prevent the occurrence of a large ripple and allow a superior transmission characteristic to be obtained.

In the above-described Preferred Embodiment Example 1, the three IDT electrodes 44 are set to be different from one another in the pitch of the electrode fingers, to set different frequency characteristics for the surface acoustic wave resonators 41 to 43. The present invention, however, is not limited thereto. For example, the three IDT electrodes 44 may be set to be different from one another in the duty ratio of the electrode fingers so as to set different frequency characteristics. The three IDT electrodes 44 may be set to be different from one another in both of the pitch and the duty ratio of the electrode fingers so as to set different frequency characteristics.

Further, in the above-described preferred embodiment, description has been made of the example in which the three surface acoustic wave resonators 41 to 43 are preferably connected in series between the antenna terminal 12 and the reception filter 20. The present invention, however, is not limited to this configuration. In the present invention, the number of elastic wave resonators connected in series between the antenna terminal and the reception filter may be set to two, or may be set to four or more. Further, in the case of three or more surface acoustic wave resonators, it is not necessarily required that all of the surface acoustic wave resonators are set to be different from one another in frequency characteristic, if it is possible to suppress the ripples. For example, in the case of three surface acoustic wave resonators, it is possible to suppress the ripples by setting different frequency characteristics only between two of the surface acoustic wave resonators.

First Modified Example

Figure 7:
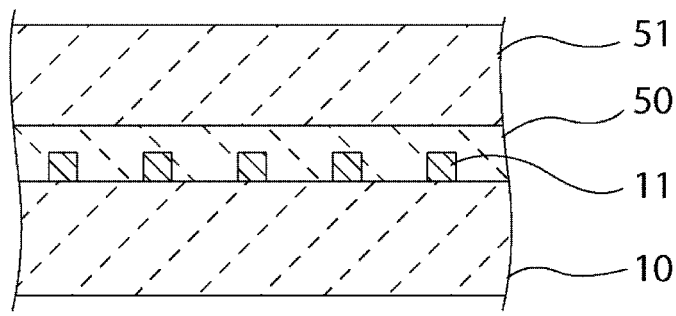
FIG. 7 is a schematic cross-sectional view of a portion of a boundary acoustic wave branching filter according to a first modified example of a preferred embodiment of the present invention.
Figure 8:
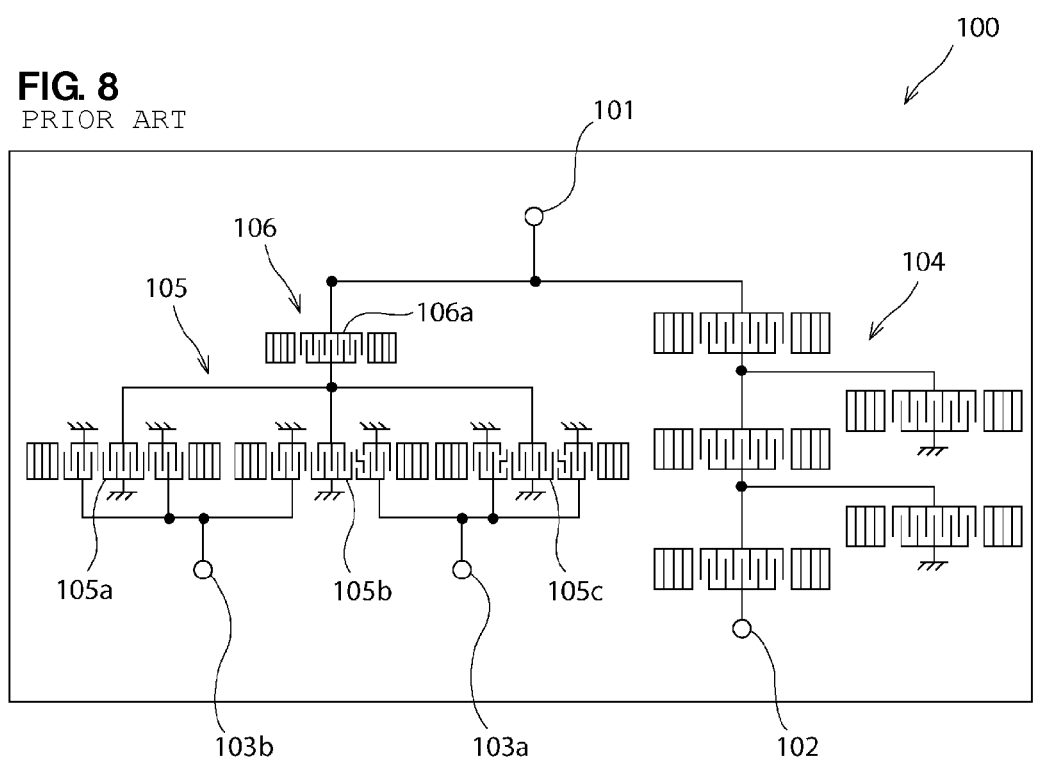
FIG. 8 is a schematic plan view of an elastic wave branching filter described in Japanese Unexamined Patent Application Publication No. 2008-5151.

FIG. 7 is a schematic cross-sectional view of a portion of a boundary acoustic wave branching filter according to a first modified example of a preferred embodiment of the present invention.

In the above-described preferred embodiment, description has been made of a preferred embodiment of the present invention with reference to, as an example, the surface acoustic wave duplexer 1 including the reception filter 20 that preferably is the longitudinally coupled resonator-type surface acoustic wave filter 21 using the surface acoustic wave. An elastic wave branching filter according to the present invention, however, is not limited to the surface acoustic wave branching filter. For example, an elastic wave branching filter according to the present invention may be a boundary acoustic wave branching filter using boundary acoustic wave, in which first and second dielectric layers 50 and 51 are arranged on the piezoelectric substrate 10 to cover the electrodes 11, as illustrated in FIG. 7. Further, only the first dielectric layer 50 of the first and second dielectric layers 50 and 51 may be provided. The materials forming the first and second dielectric layers 50 and 51 are not particularly limited, as long as the materials are capable of exciting the boundary acoustic wave. For example, the first dielectric layer 50 may be made of silicon oxide, and the second dielectric layer 51 may be made of silicon nitride, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave branching filter comprising:
   an antenna terminal;
   a transmission filter connected to the antenna terminal;
   a reception filter connected to the antenna terminal, and defined by a longitudinally coupled resonator-type elastic wave filter including a plurality of IDT electrodes arranged along a propagation direction of an elastic wave; and
   a plurality of elastic wave resonators connected in series between the antenna terminal and the reception filter; wherein a combined capacitance of the plurality of elastic wave resonators is smaller than a capacitance of an IDT electrode included in the plurality of IDT electrodes and connected to the antenna terminal.

2. The elastic wave branching filter described in claim 1, wherein at least two elastic wave resonators of the plurality of elastic wave resonators are different from each other in frequency characteristic.

3. The elastic wave branching filter described in claim 2, wherein the at least two elastic wave resonators are different from each other in pitch of electrode fingers.

4. The elastic wave branching filter described in claim 2, wherein the at least two elastic wave resonators are different from each other in duty ratio of electrode fingers.

5. The elastic wave branching filter described in claim 1, wherein a number of the elastic wave resonators is three or more.

6. The elastic wave branching filter described in claim 1, wherein the elastic wave branching filter is a surface acoustic wave branching filter or a boundary acoustic wave branching filter.

7. The elastic wave branching filter described in claim 1, wherein the elastic wave branching filter defines a surface acoustic wave duplexer or an elastic wave triplexer.

8. The elastic wave branching filter described in claim 7, wherein the elastic wave branching filter defines a surface acoustic wave duplexer that uses UMTS-Band1 for communication.

9. The elastic wave branching filter described in claim 1, further comprising a transmitting terminal and two receiving terminals.

10. The elastic wave branching filter described in claim 9, wherein an impedance of the antenna terminal and the transmitting terminal is about 50Ω and an impedance of the receiving terminals is about 100Ω.

11. The elastic wave branching filter described in claim 1, wherein the transmission filter is a longitudinally coupled resonator-type surface acoustic wave filter or a ladder elastic wave filter.

12. The elastic wave branching filter described in claim 1, further comprising reflectors arranged opposite sides of the plurality of IDT electrodes.

13. The elastic wave branching filter described in claim 1, wherein the plurality of elastic wave resonators are surface acoustic wave resonators.

14. The elastic wave branching filter described in claim 13, wherein each of the surface acoustic wave resonators has a resonant frequency located in a pass band of the reception filter and an anti-resonant frequency in an attenuation region adjacent to a high side of the pass band.

15. The elastic wave branching filter described in claim 1, further comprising an inductor connected between ground and a connection point connecting the transmission filter and the reception filter.

16. The elastic wave branching filter described in claim 1, further comprising a piezoelectric substrate and electrodes located arranged thereon to define the plurality of IDT electrodes.

17. The elastic wave branching filter described in claim 16, further comprising a dielectric film located on the piezoelectric substrate to cover the plurality of IDT electrodes.

18. The elastic wave branching filter described in claim 16, further comprising first and second dielectric films arranged on the piezoelectric substrate to cover the plurality of IDT electrodes.

* * * * *